(12) United States Patent
Shigematsu

(10) Patent No.: US 7,518,834 B2
(45) Date of Patent: Apr. 14, 2009

(54) METHOD OF MANUFACTURING A MAGNETORESISTIVE HEAD WITH SPIN-VALVE FILM

(75) Inventor: Satoshi Shigematsu, Kanagawa (JP)

(73) Assignee: Hitachi Global Storage Technologies Netherlands B.V., AZ Amsterdam (NL)

( * ) Notice: Subject to any disclaimer, the term of this patent is extended or adjusted under 35 U.S.C. 154(b) by 521 days.

(21) Appl. No.: 11/339,999

(22) Filed: Jan. 25, 2006

(65) Prior Publication Data

US 2006/0186985 A1 Aug. 24, 2006

(30) Foreign Application Priority Data

Jan. 25, 2005 (JP) ............................. 2005-016377

(51) Int. Cl.
*G01B 5/33* (2006.01)
(52) U.S. Cl. .................................. 360/324.1
(58) Field of Classification Search ............... None
See application file for complete search history.

(56) References Cited

U.S. PATENT DOCUMENTS 5,680,091 A 10/1997 Maeda et al.
6,646,834 B2 11/2003 Sano et al.

*Primary Examiner*—Mark Blouin
(74) *Attorney, Agent, or Firm*—Townsend and Townsend and Crew LLP; Rambod Nader

(57) ABSTRACT

For control of crystal grain size in a spin-valve film, a lithographic technique is needed which exhibits high productivity and enabling formation of a pattern at about 10 nm. In one embodiment of the invention, a diblock copolymer comprising polystyrene (PS) and polymethyl methacrylate (PMMA) is applied to a lower gap layer. When a liquid agent formed by mixing PS and PMMA is coated, a film structure comprising a sea-like PS tissue portion and an island-like PMMA tissue portion is obtained. By applying an ozone RIE treatment to the film structure, the sea-like PS tissue portion is etched to form a pattern of the island-like PMMA tissue portion. The lower gap layer is etched by using the island-like PMMA tissue portion as a resist, then the resist is removed, and an unevenness pattern arranged regularly on the lower gap layer can be formed. A spin-valve film is formed on the lower gap layer subjected to the unevenness fabrication.

9 Claims, 5 Drawing Sheets

METHOD OF MANUFACTURING A MAGNETORESISTIVE HEAD WITH SPIN-VALVE FILM

CROSS-REFERENCES TO RELATED APPLICATIONS

This application claims priority from Japanese Patent Application No. JP2005-016377, filed Jan. 25, 2005, the entire disclosure of which is incorporated herein by reference.

BACKGROUND OF THE INVENTION

The present invention relates to a method of manufacturing a magnetoresistive head. In particular, the invention relates to a method of manufacturing a magnetoresistive head using a spin-valve device.

A spin-valve device utilizing the giant magnetoresistive effect (GMR) has been used as a reading device for a magnetic disk drive. A stacked ferri-type spin-valve device referred to as a bottom type comprises an underlayer formed over a lower gap layer, a spin-valve film in which anti-ferromagnetic layer/first ferromagnetic layer/anti-ferromagnetic coupling layer/second ferromagnetic layer/Cu intermediate layer/free layer are stacked on the underlayer, and a protective layer formed over the free layer.

In order to increase the output of the spin-valve device, it is necessary to increase the magnetoresistive effect of the spin-valve film. As the crystal grain size of the spin-valve film increases, the resistance of the spin-valve film decreases to result in increase of the magnetoresistive effect of the spin-valve film.

Further, by increasing the sense current, higher output can be obtained even in a case of using a spin-valve film having an identical magnetoresistive effect. However, when the sense current increases, since the amount of heat generation increases, the characteristics of the spin-valve film are deteriorated by heat. In order to prevent deterioration of the characteristics of the spin-valve film by the heat, it is effective to enlarge the crystal grain size of the spin-valve film.

In view of the requirements described above, growing of the crystal grain size of the spin-valve film has been performed, and the grain size of the spin-valve film formed by a general sputtering method has a diameter of 10 nm or more and about 20 nm in a larger case.

On the other hand, along with increase in the recording density of the magnetic disk apparatus, the track width of the magnetic head has been narrowed year by year. In a reproducing device, the device width of the spin-valve device corresponds to the track width. In the plane recording density of 100 Gbit/in$^2$, the width of the reading track, that is, the width of the spin-valve device reaches 100 nm or less. Since the device height for the spin-valve device is fabricated to about the same size as that for the device width, the area of the spin-valve device is about 10,000 nm$^2$ or less for the plane recording density of 100 Gbit/in$^2$.

As the growing of the crystal grain size of the spin-valve film and miniaturization of the area of the spin-valve device progress, the number of crystal grains of the spin-valve film contained in one spin-valve device decreases. For example, in a case of manufacturing a device of 10,000 nm$^2$ by using a film with the crystal grain size of 10 nm, the number of crystal grains contained in the device is about 130 but the number of crystal grains decreases to about 30 as the crystal grain size increases to 20 nm.

Magnetic characteristics of the magnetic film undergo a significant effect depending on the crystal orientation. Spin-valve films manufactured generally comprise polycrystals and the crystal orientations are not uniform in the in-plane direction. To decrease the effect caused by variations of the crystal orientation on the magnetic characteristics, it is necessary to increase the number of crystal grains contained in the device. For example, in a case where the device contains only one crystal grain, the magnetic characteristics of the device are determined by the orientation of the crystal. That is, the magnetic characteristics of the device are varied unless the crystal orientations are aligned for all the devices. In a case where a number of crystal grains are contained in the device statistically, since the magnetic characteristics of the device no more depend on the crystal orientation or directions of individual crystal grains, variations of the magnetic characteristics between devices can be decreased. Therefore, it is theoretically desired that 300 or more of crystal grains be contained in one device. However, in order to obtain a high-read output, it is necessary to increase the crystal grain size of the spin-valve film. There exists a trade-off relation between a high-read output and small variations of the characteristics between the devices. In this case, in order to improve the yield of the devices, it is necessary to restrict the distribution of the crystal grain size and control the average value thereof precisely.

Patent Document 1 (Japanese Patent Laid-Open No. 1002-33533) discloses a method of using a crystal growth control layer as a method of controlling the crystal grain size of a spin-valve film. Patent Document 1 teaches that the crystal grain size can be controlled to within 3 to 8 nm by inserting a crystal growth control layer between the underlayer and the spin-valve film or in the spin-valve film, the crystal growth control layer comprising a material at least containing one member in the group of consisting of O, N, H, Cu, Au, Ag, and Rh. It also teaches that the crystal growth control layer may be formed dispersingly within the plane of films to be stacked.

Generally, to control the crystal grain size of the film formed by a film forming method such as sputtering, it is effective to provide unevenness with the substrate. Patent Document 2 (Japanese Patent Laid-Open No. 8-130337) discloses methods of forming unevenness in a substrate to which a magnetoresistive effect film is to be formed. A first method is to use an off-substrate of a single crystal substrate cut along a plane inclined by a predetermined angle from a crystal lattice face. A second method is to form unevenness by a photolithographic process. Since the photolithographic process can accurately control the size of the unevenness, it is suitable as a method of controlling the crystal grain size while decreasing the dispersion of the crystal grain size in the film. Further, the spin-valve film is a stack of extremely thin films and is degraded in magnetic characteristic if the height of the unevenness is increased. Accordingly, since the height for the unevenness is in the order of the atom level, that is, from 1 to 5 Å, the etching method and the photoresist for forming the unevenness have many alternatives.

BRIEF SUMMARY OF THE INVENTION

In the crystal grain size control method described in Patent Document 1, while the average value of the crystal grain size can be controlled, it is difficult to reduce the dispersion of the crystal grain size.

Since the spin-valve film is formed over an amorphous lower gap film such as of Al$_2$O$_3$ in the first method described in Patent Document 2, it is difficult to use the method. Further, in the second method, in order to control the crystal grain size of the spin-valve film to about 10 nm, it is necessary to form also the pattern size of the unevenness to substantially the same size. At present, a pattern of about 10 nm cannot be formed but only by an electron beam exposure method. Since the electron beam exposure takes much time for the exposure, the productivity is low. Accordingly, the crystal grain size control of the spin-valve film requires a lithographic technique providing high-productivity and enabling formation of a pattern of about 10 nm.

A feature of the present invention is to provide a method of manufacturing a magnetoresistive head providing high-productivity, enabling reduction in dispersion of the crystal grain size of the spin-valve film and maximizing the average value of the crystal grain size in a small range of variations in device characteristics.

A method of manufacturing a magnetoresistive head according to an aspect of the present invention comprises the steps of: applying an auto-histogenetic diblock copolymer to a lower gap layer to cause island-like tissue portions and sea-like tissue portions arranged orderly in phase separation; selectively removing either the island-like tissue portions or the sea-like tissue portions; etching the lower-gap layer using the not-removed tissue portion as a resist; removing the resist; and forming a spin-valve film on the lower gap layer whose surface has been subjected to the uneven fabrication.

In some embodiments, the diblock copolymer is a liquid agent formed by mixing polystyrene (PS) and polymethyl methacrylate (PMMA). The step of selectively removing either the island-like tissue portions or the sea-like tissue portions includes an ozone RIE treatment. A step of unevenness has a height of about 1 to 5 Å. The step of the unevenness has a width of about 3 to 20 nm. The step of forming the spin-valve film is a sputtering step.

In specific embodiments, the step of forming the spin-valve film is a step of succesively stacking an anti-ferromagnetic layer, a first ferromagnetic layer, an anti-ferromagnetic coupling layer, a second ferromagnetic layer, a non-magnetic conductor intermediate layer, and a free layer by sputtering. The anti-ferromagnetic layer comprises MnPt or MnIr, the first ferromagnetic layer comprises CoFe, the anti-ferromagnetic coupling layer comprises Ru, the second ferromagnetic layer comprises CoFe, the non-magnetic conductor intermediate layer comprises Cu, and the free layer comprises a stack of CoFe and NiFe.

In specific embodiments, the step of forming a spin-valve film is a step of successively forming an MnPt anti-ferromagnetic layer, a CoFe first ferromagnetic layer, an Ru anti-ferromagnetic coupling layer, a CoFe second ferromagnetic layer, a Cu non-magnetic conductor intermediate layer, and a free layer formed by stacking CoFe and NiFe by sputtering on an underlayer formed by stacking NiFeCr and NiFe. The method may further include a step of stacking Cu and Ta on the free layer to form a protective layer.

A method of manufacturing the magnetoresistive head according to another aspect of the invention comprises the steps of: forming a lower magnetic shield layer over a substrate; forming a lower gap layer over the lower magnetic shield layer; applying an auto-histogenetic diblock copolymer over the lower gap layer to cause island-like tissue portions and sea-like tissue portions arranged orderly in phase separation; selectively removing either the island-like tissue portions or the sea-like tissue portions; etching the lower gap layer using the not removed tissue portion as a resist; removing the resist; forming a spin-valve film over the lower gap layer whose surface has been subjected to unevenness fabrication; forming an upper gap layer over the spin-valve film; and forming an upper magnetic shield layer over the upper gap layer.

A method of manufacturing the magnetoresistive head according to another aspect of the invention comprises the steps of: forming a lower magnetic shield layer over a substrate; forming a lower gap layer over the lower magnetic shield layer; applying an auto-histogenetic diblock copolymer over the lower gap layer to cause island-like tissue portions and sea-like tissue portions arranged orderly in phase separation; selectively removing either the island-like tissue portions or the sea-like tissue portions; etching the lower gap layer using the not removed tissue portion as a resist; removing the resist; forming a spin-valve film over the lower gap layer whose surface has been subjected to unevenness fabrication; forming an upper gap layer over the spin-valve film; forming an upper magnetic shield layer over the upper gap layer; and forming a magnet inductive recording head adjacent to the upper magnetic shield layer.

The present invention can provide a method of manufacturing a magnetoresistive head providing high-productivity, enabling reduction in dispersion of the crystal grain size of the spin-valve film and maximizing the average value of the crystal grain size in a small range of variations in device characteristics.

DETAILED DESCRIPTION OF THE INVENTION

Figure 1A:
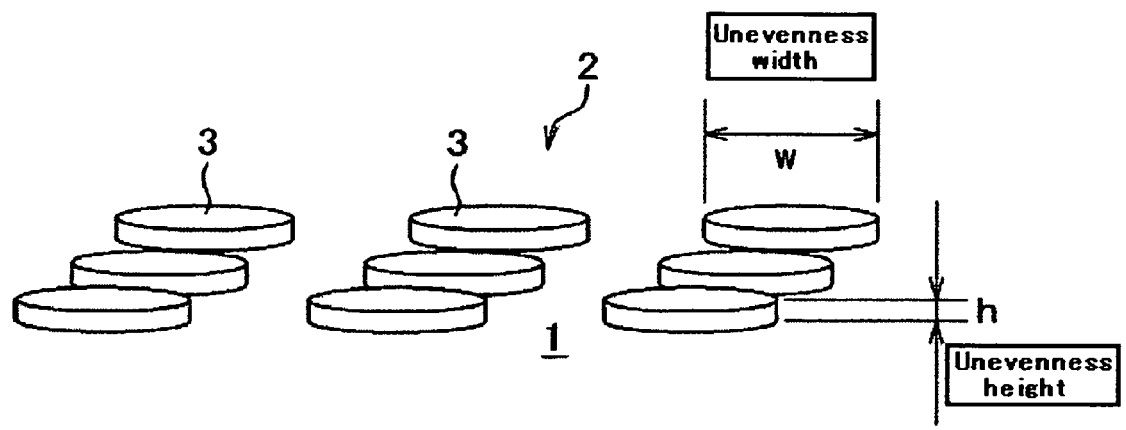
FIG. 1A is a perspective view of an unevenness pattern formed on a lower gap layer according to one embodiment of the present invention.
Figure 1B:
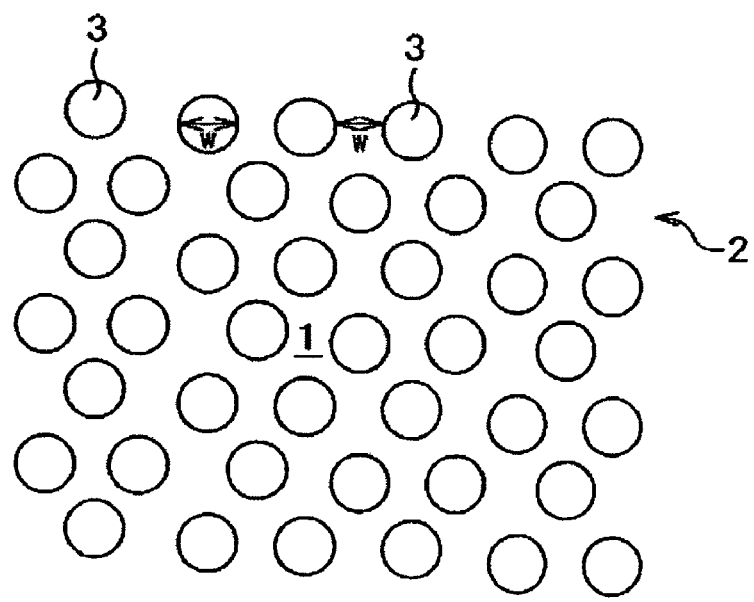
FIG. 1B is a plan view of the unevenness pattern.
Figure 2:
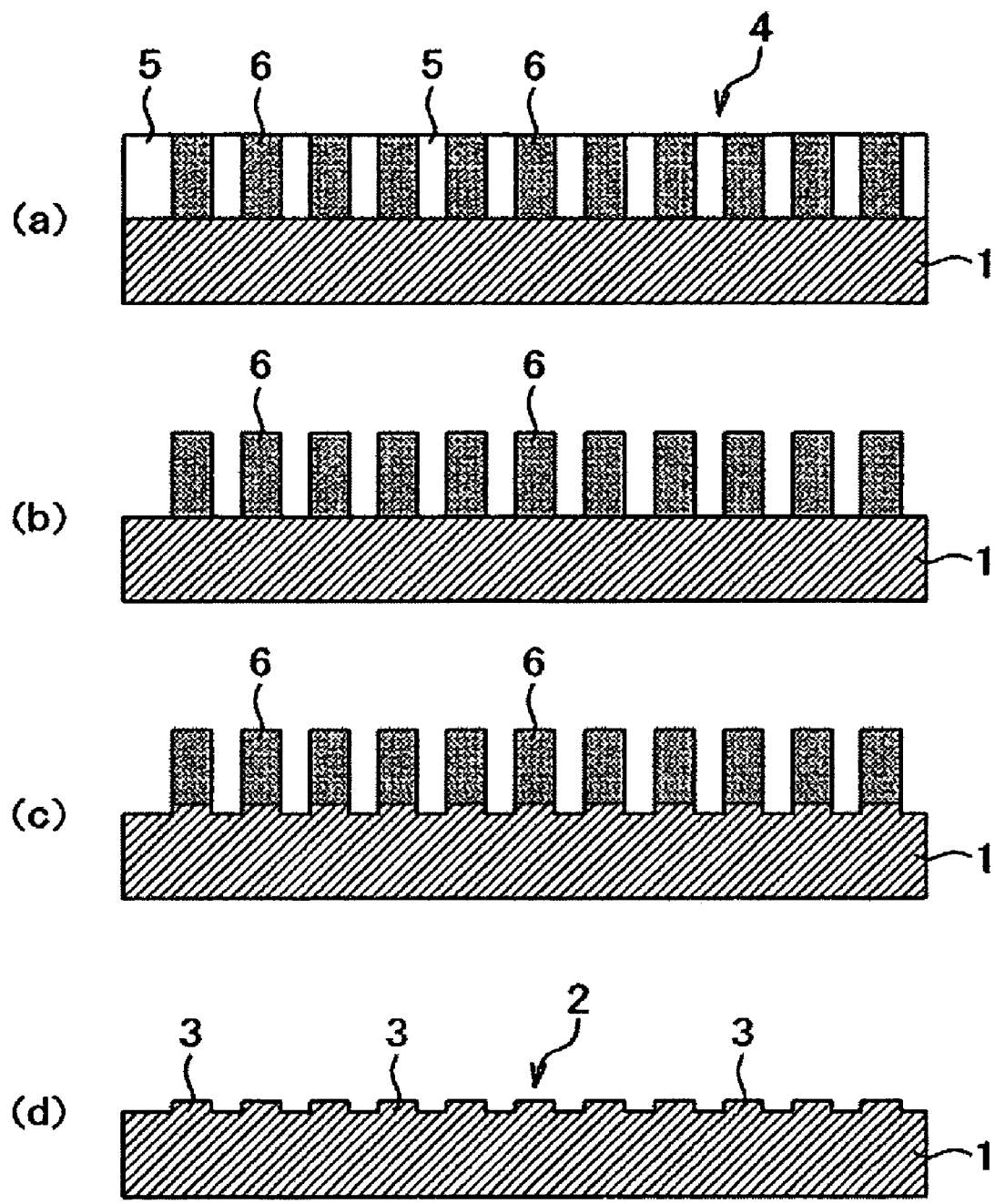
FIG. 2 is a view showing a process for forming the unevenness pattern to the lower gap layer.

An embodiment of the present invention will be described with reference to FIGS. 1A, 1B, 2, and 3. At first, to control the crystal grain size of a spin-valve film, an unevenness pattern 2 is formed which is arranged regularly on a lower gap layer 1 as an underlying substrate as shown in FIGS. 1A and 1B. FIG. 1A is perspective view and FIG. 1B is a plan view. The lower gap layer 1 is a film comprising an insulative material such as of $Al_2O_3$. While the unevenness pattern 2 comprises columnar convex protrusions 3 in FIGS. 1A and 1B, it may also comprise columnar concave portions. The convex portions 3 (or concave portions) are arranged regularly. A height (unevenness height: h) of the convex portion 3 (or concave portion) is from about 1 to 5 Å. The diameter (unevenness width w) of the convex portion 3 (or concave portion) is from about 3 to 20 nm.

In this embodiment, for fabrication of the unevenness pattern 2 to the lower gap layer 1, a fabrication method of using the auto-histogenetic film of a diblock copolymer is utilized. A specific fabrication method will be described with reference to FIG. 2.

At first, as shown in FIG. 2(a), a diblock copolymer 4 as a resist pattern is applied to a lower gap layer 1. As the diblock copolymer 4, a diblock copolymer, for example, comprising polystyrene (PS) and polymethyl methacrylate (PMMA) can be used. By controlling the compositional ratio and the molecular weight of the block copolymer, a structure in which block copolymers are phase-separated into various shapes can be obtained. For example, when a liquid agent formed by mixing PS and PMMA is coated, a structure comprising a sea-like PS tissue portion 5 and island-like PMMA tissue portion 6 can be obtained.

Then, as shown in FIG. 2(b), by applying an ozone RIE (Reactive Ion Etching) treatment to the diblock copoymer 4, the sea-like PS tissue portion 5 is etched to form the pattern of the island-like PMMA tissue portion 6.

Then, using the island-like PMMA tissue portion as resist, the lower gap layer 1 is etched as shown in FIG. 2(c). Successively, when the resist 6 is removed as shown in FIG. 2(d), an unevenness pattern 2 can be formed in which convex portions 3 (or concave portions) are regularly arranged on the lower gap layer 1.

The step height of the unevenness pattern is from about 1 to 5 Å; that is, the amount of fabrication is extremely small. Accordingly, even when the solution of the diblock copolymer forms an extremely thin film, it can function sufficiently as the resist.

Figure 3:
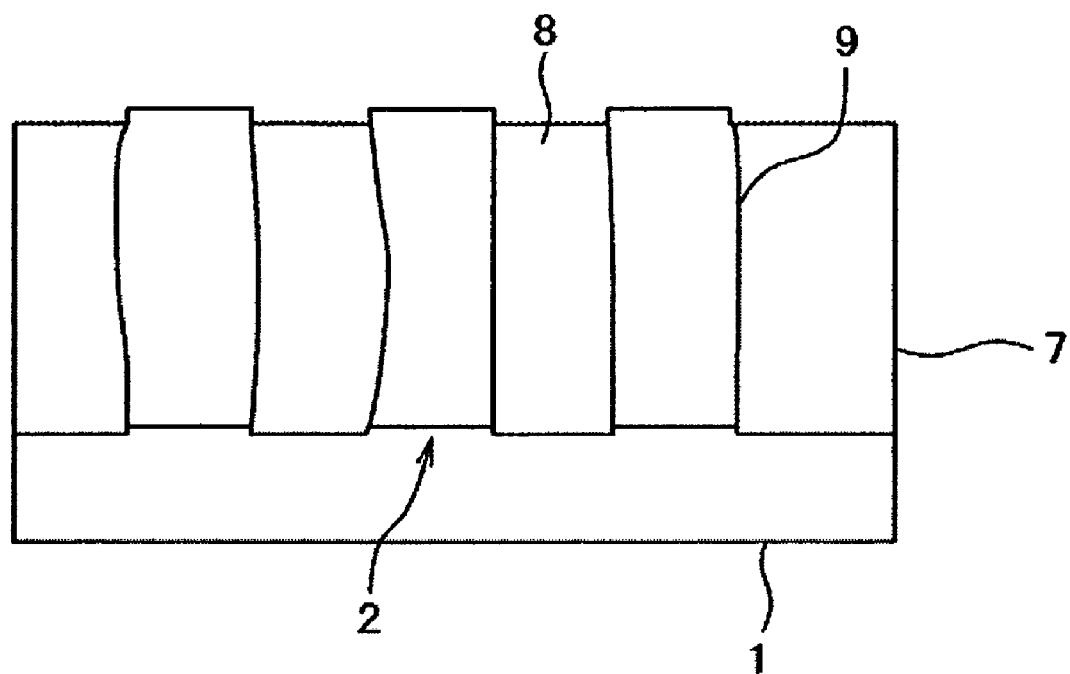
FIG. 3 is a view showing crystal grains of a spin-valve film formed over the unevenness pattern.

Successively, as shown in FIG. 3, a spin-valve film 7 is formed over the lower gap layer 1 subjected to unevenness fabrication. The spin-valve film 7 can be formed by a film formation method used customarily such as a sputtering method.

When the spin-valve film 7 is formed over the lower gap layer 1 subjected to the unevenness fabrication as described above, the crystal grains 8 of the spin-valve 7 scarcely grow overriding the step in the unevenness pattern 2 and the crystal grain boundaries 9 of the spin-valve film 7 are present at a high provability in the step portion of the unevenness pattern 2. Accordingly, the crystal grain size of the spin-valve film 7 distributes at a size less than the unevenness pattern 2. By controlling the size of the unevenness pattern 2, the average value for the crystal grain size can be maximized within a small range of the variations of the device characteristics. FIG. 3 shows this state. In this embodiment capable of reducing the dimensional variations of the unevenness pattern 2, the dispersion of the grain size in the spin-valve film 7 can be controlled to a reduced level.

Figure 4:
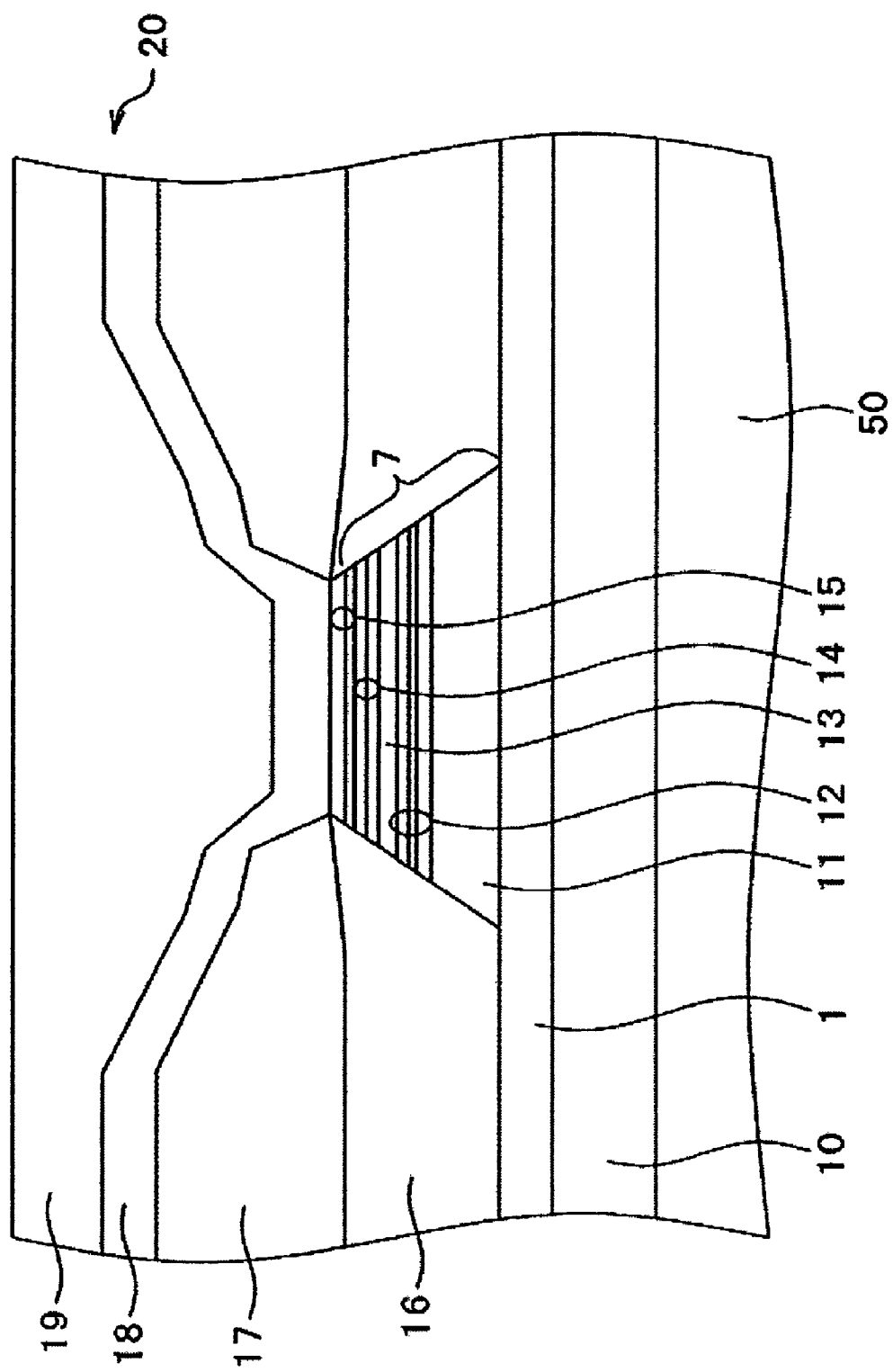
FIG. 4 is a constitutional view of a magnetoresistive head as viewed from the side of an air bearing surface.

FIG. 4 shows a constitutional example of a magnetoresistive head 20 having the spin-valve film 7 according to the embodiment described above as viewed on the side of the air bearing surface thereof. The constitutional example shown in FIG. 4 will be described in the order of manufacturing steps. A lower magnetic shield layer 10 comprising, e.g., NiFe is formed by way of plating or the like on a substrate 50 made of ceramics, etc. as a slider. A lower gap layer 1 comprising an insulative material such as of $Al_2O_3$ is formed on the shield layer 10 by sputtering, etc. The unevenness pattern 2 described above is formed on the surface of the lower gap layer 1. A spin-valve film 7 is formed by sputtering, etc. over the unevenness pattern 2 of the lower gap layer 1. A protective layer 15 comprising a single layer of Cu or Ta or a stack thereof is formed by sputtering, etc. over the spin-valve film 7.

A magnetic domain control layer 16 comprising CoCrPt, etc. is formed on both ends of the spin-valve film 7 by sputtering, etc., over which an electrode layer 17 comprising Ta, etc. is formed. An upper gap layer 18 comprising an insulative material such as of $Al_2O_3$ is formed over the electrode layer 17 and the protective layer 15 by sputtering, etc. An upper magnetic shield layer 19 comprising, for example, NiFe is formed over the upper gap layer 18 by plating, etc.

The spin-valve film 7 is formed by successively stacking an anti-ferromagnetic layer 11 comprising MnPt or MnIr, a pinned layer 12 formed by stacking a first ferromagnetic layer comprising, e.g., CoFe, an anti-ferromagnetic coupling layer comprising, e.g., Ru, and a second ferromagnetic layer comprising, e.g., CoFe, a non-magnetic conductor intermediate layer 13 comprising, e.g., Cu, and a free layer 14 formed by stacking a third ferromagnetic layer comprising, e.g., CoFe and a fourth ferromagnetic layer comprising, e.g., NiFe.

The specific compositional constitutions and thicknesses of the respective layers of the spin-valve film 7 are shown in the order of the stacking as follows: MnPt 180 Å/CoFe 15 Å/Ru 8 Å/CoFe 20 Å/Cu 20 Å/CoFe 10 Å/NiFe 20 Å/Cu 10 Å/Ta 20 Å. The spin-valve film is a stack of extremely thin layers in which the thinnest Ru layer is 8 Å. Incidentally, as an underlayer for crystal control, for example, NiFe 32 Å/NiFe 8 Å may also be formed between the lower gap layer 1 and the anti-ferromagnetic layer 11.

Figure 5:
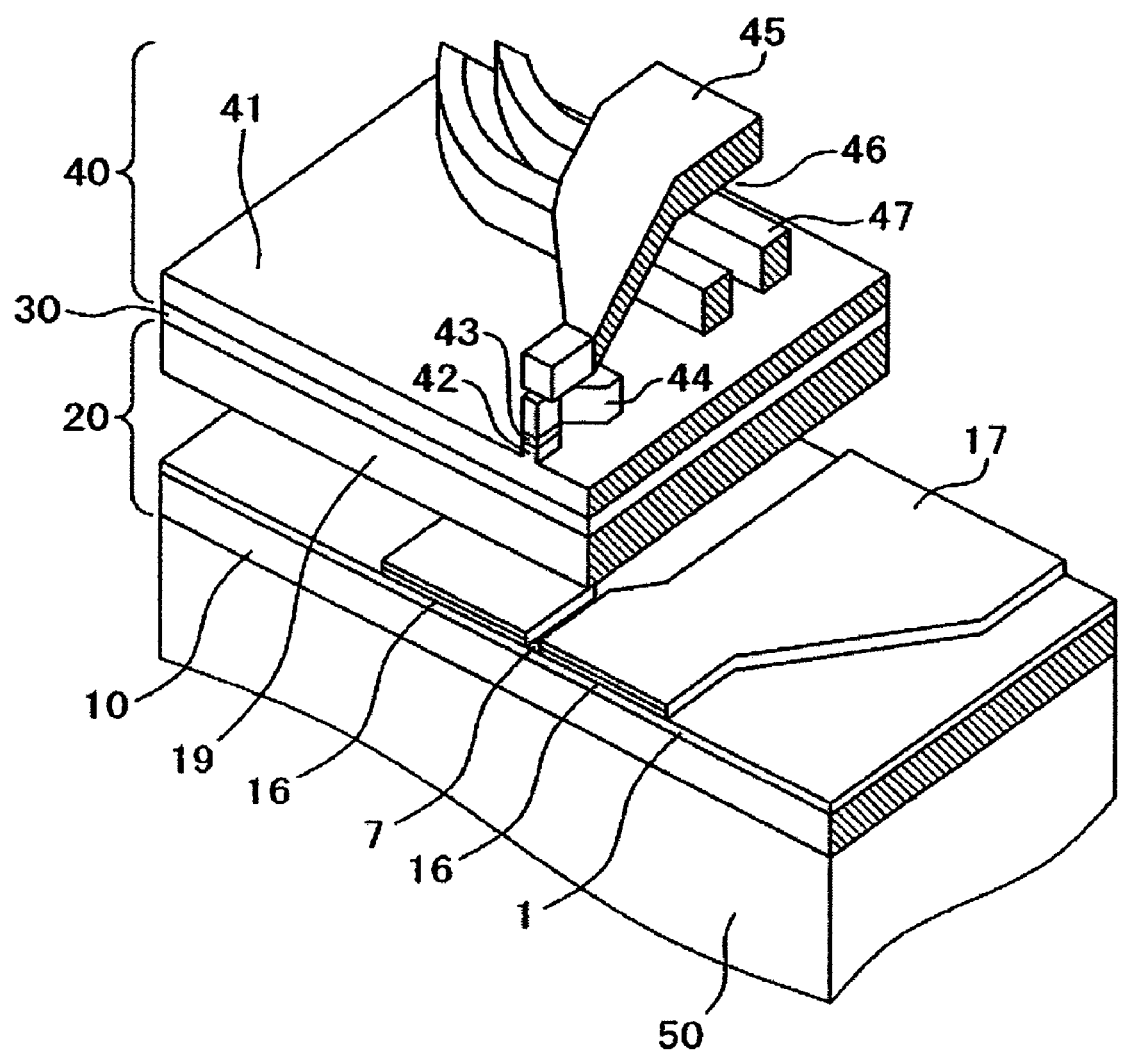
FIG. 5 is a perspective view of a read/write separation type magnetic head (magnetoresistive head) as viewed from the side of the air bearing surface.

FIG. 5 shows a constitutional example of a read/write separated type magnetic head in which a magnetic induction type recording head 40 is disposed adjacent with the magnetoresistive head 20 as the read head (also referred to as magnetoresistive head). A separation film 30 comprising an insulative material such as of $Al_2O_3$ is formed over the magnetoresistive head 20 by sputtering, etc., over which a magnetic induction type recording head 40 is formed by a plating method or a sputtering method. The magnetic induction type write head 40 comprises: a lower magnetic layer 41; a lower magnetic pole piece 42 formed at the end of the lower magnetic layer 41; an upper magnetic pole piece 44 formed by way of a magnetic gap film 43 opposed to the lower magnetic pole piece 42; an upper magnetic layer 45 which is a yoke for the magnetic pole piece 44 and is connected at the back gap portion with the lower magnetic layer 41; and conductor coils 47 formed in an interlayer insulative layer 46 between the lower magnetic layer 41 and the upper magnetic layer 45. The upper portion of the magnetic induction type write head 40 is covered with a hard protective layer (not illustrated).

As described above, according to the embodiment of the invention, since the dispersion of the crystal grain size of the spin-valve film can be reduced and the average value of the crystal grain size can be maximized within the small range of the variations of device characteristics, a magnetoresistive head exhibiting high-read output and having less variations of the device characteristics can be obtained.

It is to be understood that the above description is intended to be illustrative and not restrictive. Many embodiments will be apparent to those of skill in the art upon reviewing the above description. The scope of the invention should, therefore, be determined not with reference to the above description, but instead should be determined with reference to the appended claims along with their full scope of equivalents.

What is claimed is:

1. A magnetoresistive head comprising:
    a lower gap layer;
    an auto-histogenetic diblock copolymer disposed on the lower gap layer and having an unevenness pattern of island-like portions and sea-like portions, each island-like portion being higher than the sea-like portions by a step of unevenness; and
    a spin-valve film disposed on the unevenness pattern of the lower gap layer.

2. A magnetoresistive head according to claim 1, wherein the step of the unevenness has a height of about 1 to 5 Å.

3. A magnetoresistive head according to claim 1, wherein the step of the unevenness has a width of about 3 to 20 nm.

4. A magnetoresistive head according to claim 1, wherein the spin-valve film comprises a stack of an anti-ferromagnetic layer, a first ferromagnetic layer, an anti-ferromagnetic coupling layer, a second ferromagnetic layer, a non-magnetic conductor intermediate layer, and a free layer.

5. A magnetoresistive head according to claim 4, wherein the anti-ferromagnetic layer comprises MnPt or MnIr, the first ferromagnetic layer comprises CoFe, the anti-ferromagnetic coupling layer comprises Ru, the second ferromagnetic layer comprises CoFe, the non-magnetic conductor intermediate layer comprises Cu, and the free layer comprises a stack of CoFe and NiFe.

6. A magnetoresistive head according to claim 1, wherein the spin-valve film comprises an MnPt anti-ferromagnetic layer, a CoFe first ferromagnetic layer, an Ru anti-ferromagnetic coupling layer, a CoFe second ferromagnetic layer, a Cu non-magnetic conductor intermediate layer, and a free layer.

7. A magnetoresistive head according to claim 6, further comprising a stack of Cu and Ta on the free layer to form a protective layer.

8. A magnetoresistive head according to claim 1, wherein the lower gap layer is disposed over a lower magnetic shield layer which is disposed over a substrate, and further comprising an upper gap layer disposed over the spin-valve film and an upper magnetic shield layer disposed over the upper gap layer.

9. A magnetoresistive head according to claim 8, further comprising a magnetic inductive recording head adjacent to the upper magnetic shield layer.

\* \* \* \* \*